US012794258B2

(12) United States Patent
Pieschkalla et al.

(10) Patent No.: US 12,794,258 B2
(45) Date of Patent: Nov. 10, 2026

(54) ELECTRICAL SUPPLY DEVICE AND METHOD FOR THE ELECTRICAL SUPPLY OF ACCUMULATORS WITH A SUPPLY INTERFACE ACCORDING TO THE USB STANDARD

(71) Applicant: BURY SP. Z. O. O., Mielec (PL)

(72) Inventors: Christian Pieschkalla, Bünde (DE); Marco C. Milazzo, Herford (DE); Krzysztof Wdowiak, Dabrowica (PL); Krzysztof Zajdel, Równe (PL)

(73) Assignee: BURY SP. Z. O. O., Mielec (PL)

( * ) Notice: Subject to any disclaimer, the term of this patent is extended or adjusted under 35 U.S.C. 154(b) by 0 days.

(21) Appl. No.: 18/978,758

(22) Filed: Dec. 12, 2024

(65) Prior Publication Data

US 2025/0233442 A1 Jul. 17, 2025

(30) Foreign Application Priority Data

Dec. 20, 2023 (DE) ..................... 10 2023 136 073.6

(51) Int. Cl.
*H02J 7/90* (2026.01)
*G01R 19/00* (2006.01)
(Continued)

(52) U.S. Cl.
CPC .......... *H02J 7/975* (2026.01); *G01R 19/0046* (2013.01); *G06F 1/26* (2013.01);
(Continued)

(58) Field of Classification Search
CPC .......... H02J 7/007192; H02J 7/04; H02J 7/00; H02J 2207/20; H02J 2207/40;
(Continued)

(56) References Cited

U.S. PATENT DOCUMENTS

2016/0013717 A1* 1/2016 Li .......................... H02M 3/156 323/234
2016/0254748 A1* 9/2016 Schmitz ................ H02M 3/156 323/271
2018/0232021 A1* 8/2018 Perchlik .................. G06F 1/206

* cited by examiner

*Primary Examiner* — Ryan Johnson
(74) *Attorney, Agent, or Firm* — WCF IP

(57) ABSTRACT

An electrical supply device (1) according to the Universal Serial Bus (USB) standard with a controller (5) and a USB plug contact connection is described. The supply device (1) can be connected or is connected to an input voltage source ($V_{BAT}$) and provides an electrical output supply power ($P_{BUS}$) at the USB plug contact connection. The controller (5) has an input voltage measuring unit (2) for measuring the input voltage ($V_{IN}$) applied to the input of the supply device (1) and/or a temperature measuring unit (6) for measuring the temperature ($T_t$) in the area of the supply device (1). The controller (5) is configured to limit the output supply power ($P_{BUS}$) using the currently measured input voltage ($V_{IN}$) and/or the currently measured temperature ($T_t$) as a controlled variable.

13 Claims, 5 Drawing Sheets

Figure 1:
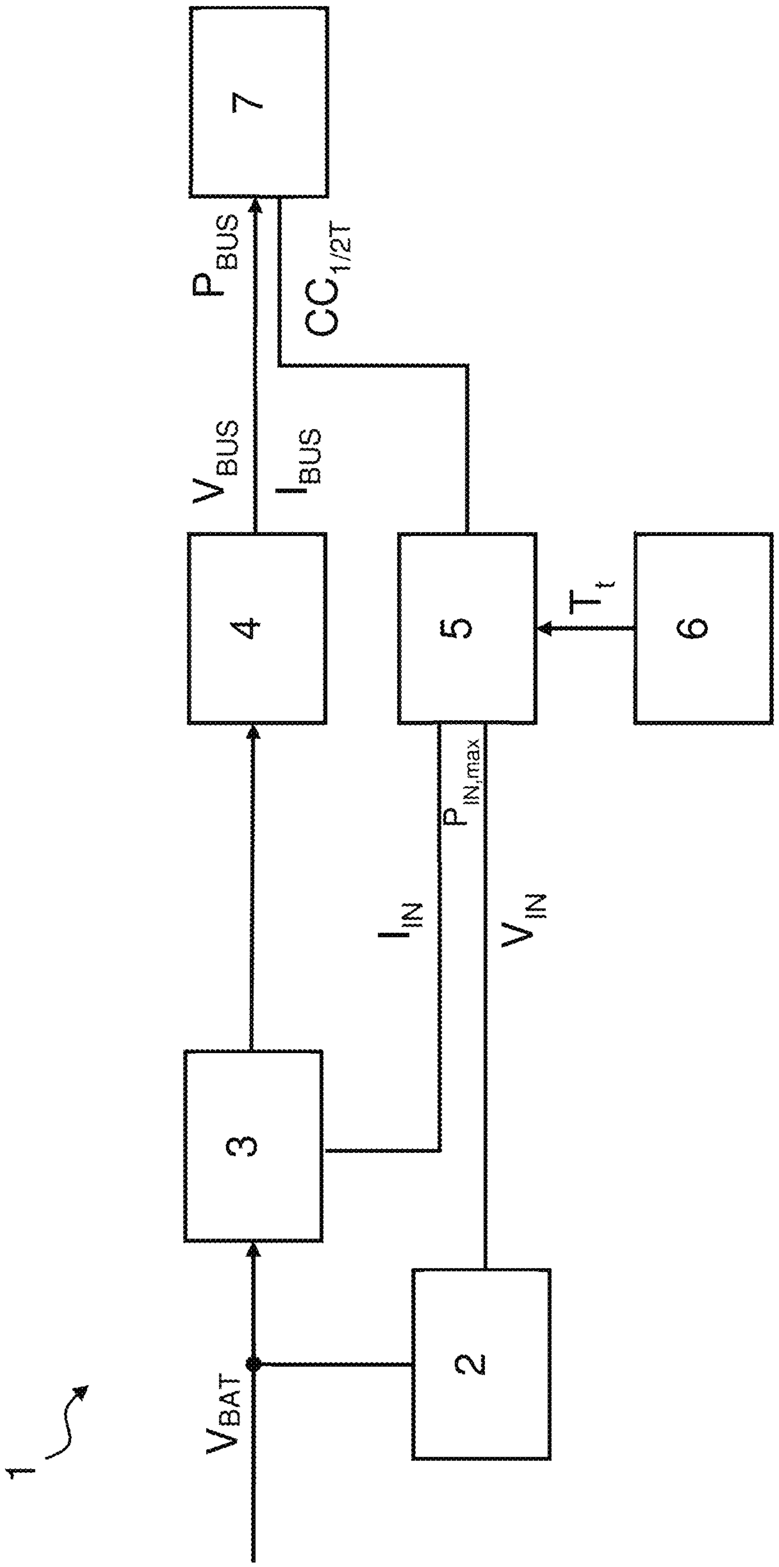

(51) Int. Cl.

*G06F 1/26* (2006.01)
*G06F 1/28* (2006.01)
*H02J 7/04* (2006.01)
*H02J 7/65* (2026.01)
*H02J 7/80* (2026.01)

(52) U.S. Cl.

CPC .................. *G06F 1/28* (2013.01); *H02J 7/04* (2013.01); *H02J 7/65* (2026.01); *H02J 7/80* (2026.01); *G06F 2213/0042* (2013.01)

(58) Field of Classification Search

CPC ................ H02J 7/00712; H02M 3/156; G06F 2213/0042; G06F 1/28; G06F 1/266; G06F 1/26

See application file for complete search history.

ELECTRICAL SUPPLY DEVICE AND METHOD FOR THE ELECTRICAL SUPPLY OF ACCUMULATORS WITH A SUPPLY INTERFACE ACCORDING TO THE USB STANDARD

The invention relates to an electrical supply device according to the Universal Serial Bus (USB) standard with a controller and a USB plug contact connection, wherein the supply device can be connected or is connected to an input voltage source and the supply device provides an electrical output supply power regulated by the controller at the USB plug contact connection.

The invention further relates to a method for the electrical supply of accumulators with a supply interface according to the Universal Serial Bus (USB) standard with an electrical supply device.

In particular, the invention relates to a power supply system in a motor vehicle via a USB interface (Universal Serial Bus).

The USB interface is a manufacturer-independent interface standard that makes it possible to connect various peripherals of a computer system to a main device, e.g. a computer, via a standardized plug connection. Before the introduction of this universal interface, computers had a large number of different interfaces, such as serial interfaces, parallel interfaces, keyboard and mouse interfaces, network interfaces or monitor interfaces. These interfaces were each designed for a specific data communication, but with the exception of the keyboard and mouse interfaces, they did not provide a power supply for the external apparatus. This meant that the external apparatus also had to be supplied with power using a plug-in power adapter, for example. In particular, this concerned external storage media or scanners or label printers, etc.

With the introduction of the USB interface, a number of the previously mentioned physical interfaces became obsolete, as either the apparatus to be connected also had the new USB interface, or there were adapters that converted the USB protocol to the old interface standard. This meant that mobile computers in particular only had a plurality of USB interfaces instead of the conventional ones such as serial or parallel interfaces. Another advantage of the new USB interface standard was the availability of a power supply for the external apparatus. The voltage was fixed at 5.0 V and a maximum current of 0.5 A was enabled via a protocol sequence, which then provided a power of 2.5 W per interface. This power was sufficient for many apparatuses, which meant that no additional power supply had to be connected.

This interface established itself as a general charging interface for cell phones, in particular in the embodiment of micro USB. However, the maximum available power of 2.5 W was no longer sufficient, so charging currents of up to about 2.5 A were defined. At a constant charging voltage of 5.0 V, cell phones could be fully charged in one to two hours.

During the transition to the new USB-C interface standard, the Power Delivery profile was developed for the power supply, which can deliver a variable voltage of up to 20 V at a maximum current of 5 A, which means that 100 W of power can be transmitted. Further developments provide for output voltages of up to 48 V at 5 A in order to achieve powers of up to 240 W.

When installed in a motor vehicle, these powers must be generated from an input voltage of 12 V, which can lead to very high input currents. Furthermore, there are different operating points of such a circuit, for which the efficiency is also different. Particularly at full power consumption, i.e. at an output voltage of 20 V and an output current of 5 A and at a low input voltage (manufacturers often require functionality from 6 V), a very high input current is generated, which on the one hand results in higher heat generation in the input filter components and in the semiconductor switches, but on the other hand can also trigger the vehicle fuse for protecting the USB supply module.

US 2006/0020736 A1 describes a method for improving information transmission via USB with a hub-based extension in which power is distributed via auxiliary cables that are different from the signal and power cables of conventional USB cables. Additional signals enable optimization of the power distribution for supplying power to connected apparatuses and for detecting and handling invalid connection configurations. Alternatively, signaling techniques that do not use reflective and fast common-mode signals can also be used.

US 2008/0177436 A1 discloses a communication system for use within a vehicle, between vehicles and other remotely located apparatuses, comprising a control hub for managing and analyzing multiple incoming wireless and wired data streams. There is also at least one sensor module that communicates wirelessly with the control node. A sensor panel interface can be used to check information from the sensor modules, and a distributed mesh network can be used to support at least two levels therein.

EP 3 382 502 B1 discloses a power supply device with a plurality of USB ports that comply with a USB (Universal Serial Bus) PD (Power Delivery) standard. The device has a plurality of electrical power supply circuits provided corresponding to the connections and supplying power to power receiving apparatuses coupled to the ports, and a controller which maintains a table of current profiles to which the current receiving capabilities for each power receiving apparatus are set, and which controls the electrical power supply circuits based on the table such that the total power supplied by the electrical power supply circuits does not exceed a prescribed value.

US 2027/0288421 A1 discloses a battery charging system having a battery controller for determining a servo target based on the lower of a current error or a voltage error, and a charge controller for adjusting the operation of a power converter based on the servo target. The current error is determined by the battery controller based on a battery current and a target current. In response to the battery current approaching the target current, the target current is updated with a new current value by a charging profile selector. The voltage error is determined by the battery controller based on a battery voltage and a target voltage. In response to the battery voltage approaching the target voltage, the charging profile selector updates the target voltage with a new voltage value.

The object of the present invention is to create an improved electrical supply device according to the Universal Serial Bus standard with a controller and a USB plug contact connection and an improved method for the electrical supply of loads, in particular for charging accumulators, with a supply interface according to the Universal Serial Bus (USB) standard with an electrical supply device which prevents overloading, for example due to overcurrent or overtemperature, when the power supply is running efficiently.

The object is achieved by the electrical supply device with the features of claim 1 and by the method with the features of claim 9. Advantageous embodiments are described in the dependent claims.

It is proposed that the controller has an input voltage measuring unit for measuring the input voltage applied to the input of the supply device and/or a temperature measuring unit for measuring the temperature in the area of the supply device, and that the controller is configured to effect a limitation of the output supply power using the currently measured input voltage and/or the currently measured temperature as a controlled variable.

This ensures that the electrical energy can always be supplied at the highest possible power and that the power is reduced in critical situations or to avoid interim cooling times without energy supply in the event of temporary temperature increases in order to prevent the fuse from tripping or the apparatus from overheating.

During a supply process, in particular when charging an accumulator, it can be achieved that a maximum permissible output supply power is determined, which ensures that a maximum permissible temperature is not exceeded during the supply or charging process and the process is thus carried out efficiently with limited, optimum output supply power without interim shutdown, which would otherwise be necessary if the temperature were exceeded.

The output supply power can be limited, for example, by transmitting a maximum permissible output supply power to the connected apparatus, e.g. a maximum permissible output current for an output voltage specified by the apparatus. The control for limiting the output supply power drawn from the apparatus via the USB supply interface is then carried out by the apparatus, i.e. the current collector. The supply device limits the output supply power by transmitting the maximum permissible output supply power to the connected apparatus, for example in the form of a determined maximum permissible output current.

For this purpose, several electrical variables and the temperature can be measured in the circuit of the electrical supply device. The electrical variables include the input voltage and the input current, from which the electrical input power is calculated from the product of the input voltage and the input current. Furthermore, the electrical variables output current and desired output voltage can be used to calculate the desired output power, in particular the maximum permissible output power from the product of output voltage and output current if a maximum permissible output current is assumed.

The controller may have an input current measuring unit for measuring the input current applied to the input of the supply device. The controller can be configured to limit the output supply power using the currently measured input current as the controlled variable. The current can be tapped as a voltage value via a shunt resistor, for example, which can then be fed to an analog-to-digital converter. Alternatively, the controller can be configured to limit the output supply power by limiting the input current using the currently measured output current as the controlled variable.

The controller can be configured to determine the efficiency of the electrical supply device. The controller can be configured to effect a limitation of the output supply power using the currently determined efficiency as the controlled variable.

By utilizing the efficiency, it is possible to combine the various influencing variables, such as input current, input voltage, output current and output power as well as temperature, on the course of the energy supply and on the load on the supply device and the load, such as in particular current load and temperature, in a single characteristic variable.

The controller can have a data memory in which a table with supporting values is stored, consisting of a characteristic variable or a combination of characteristic variables selected from the characteristic variables input voltage, input current, output current and output voltage, and the respective associated efficiency. The temperature can optionally be taken into account in the table as an additional characteristic variable. The controller can be configured to determine the efficiency of the electrical supply device by reading out the efficiencies for the supporting values from the table that are close to the currently determined at least one characteristic variable selected from the group of input voltage, input current, output current and desired output voltage, and optionally according to the further characteristic variable temperature, and interpolating the efficiency from the efficiencies read out for the supporting values.

The input voltage can be fed to an analog input of a microcontroller of the controller via a voltage divider. For the input current, the dropping voltage can be detected by an operational amplifier as a differential amplifier via a shunt resistor and the amplified differential voltage can also be fed to another analog input of the microcontroller. The microcontroller can have a data memory containing a table with the combination of a characteristic variable or a group of characteristic variables and the associated efficiency.

The at least one characteristic variable can be selected from the group of input voltage, input current, output current and output voltage. Optionally, the temperature can be taken into account in the table as an additional characteristic variable for the efficiencies. As the microcontroller's data memory cannot accommodate an infinite number of combinations of electrical values, the table can refer to a few exemplary points, i.e. supporting points. The data for the values actually measured are then interpolated using the data from the table at the supporting points for the exemplary values close to the measured values. Instead of storing the values in a data memory, a calculation rule can also be stored in the microcontroller.

The controller can be configured to determine the efficiency of the electrical supply device by calculating the efficiency for the characteristic variable or combination of characteristic variables. The at least one characteristic variable can be selected from the group of input voltage, input current, output current, output voltage and temperature.

The controller can be configured to determine the current efficiency when the currently measured input voltage, input current and/or temperature changes. The controller can be configured to effect a limitation of the output supply power using a calculated maximum output current as the controlled variable. For this purpose, the following steps can be performed:

a) determining the maximum input power from the measured input voltage and the maximum permissible input current;
b) determining the expected efficiency by interpolation from supporting values for efficiencies for a characteristic variable or a combination of characteristic variables, wherein the characteristic variable is selected from the group of input voltage, maximum permissible input current, output current and desired output voltage; and
c) calculating the maximum output current from the maximum input power, the determined efficiency and the desired output voltage.

If the values change, e.g. the input voltage, the efficiency can be continuously recalculated and the maximum available output current can be renegotiated with the current collector, i.e. the load applied to the USB interface of the supply device. The following steps can be run through, for example to prevent an input fuse from being triggered or to prevent an overload:

a) determining the maximum input power from the measured input voltage and maximum permissible current;
b) determining the expected efficiency by interpolation;
c) calculating the maximum output current from the maximum input power, efficiency and output voltage.

The desired output voltage usually remains constant and is unchanged even if values are changed. This means that the desired output voltage does not have to be renegotiated with the current collector if values are changed. However, a step of determining any changes in the desired output voltage is conceivable. This can be done by asking the current collector whether anything has changed in the previous desired output voltage, or by a general query of the output voltage desired by the current collector, even if said output voltage is unchanged.

The available output current can be transmitted to the current collector. This means that the output power drawn from the current collector via the USB interface can be regulated by the current collector and, in particular, limited to the determined output current that is specified as the maximum permissible current by the electrical supply device.

Another aspect of this invention is to provide optimum output power without the apparatus overheating. Typically, current USB charging modules provide full power at the beginning and throttle the power or switch it off completely when the temperature inside the module rises critically. As a result, the full power is initially available to charge the battery of a cell phone, but after some time only part of the power or none at all is available. Only when the module has reached a temperature below a critical threshold is full power available again for some time. If a lower power is available from the outset, but is then continuously available, this can have the overall advantage that this reduced power is greater on average than the constantly interrupted power from the first case. This means that a cell phone can be fully charged more quickly overall.

The controller can be configured to effect a limitation of the output supply power with a calculated specified output current or with a calculated specified input current as the controlled variable, with the steps of:

a) determining the desired output voltage;
b) determining the current temperature;
c) determining the maximum permissible losses in the electrical supply device as a function of the maximum input power, taking into account the determined current temperature and a limit temperature specified as the maximum permissible;
d) determining the expected efficiency from a characteristic variable or a combination of characteristic variables, wherein the characteristic variable is selected from the group of input voltage, maximum permissible input current, output current and desired output voltage; and
d) determining the specified output current, taking into account the at least one characteristic variable selected from the group of measured input voltage, output current or desired output voltage, the determined maximum permissible losses and the expected efficiency.

A determined specified output current can be used as the controlled variable to limit the electrical power for predictive prevention of an excessive temperature increase during a supply process, in particular during a charging process of an accumulator. For this purpose, a message can be sent to the current collector indicating the determined, available output current and the output voltage.

The controller can be configured to limit the output supply power, taking into account a temperature increase to be expected during a supply process, in particular a charging process, and a specified limit temperature. For this purpose, the controller is configured to determine the expected temperature increase, taking into account the initial ambient temperature measured at the start of the supply or charging process, the initial temperature of the supply device measured at the start of the supply or charging process, the supply power, the initial state of charge and the nominal capacity of the accumulator to be charged in the charging process, the expected charging time, the temperature curve during the charging process and/or states from previous charging processes.

The temperature increase of the electrical supply device, i.e. the USB supply or charging module, over time depends on the design of the supply device and is generally known.

The purpose of the procedure described above is to select the output supply current of the USB supply interface such that by the end of the charging process the expected temperature increase of the electronics for a further necessary power reduction is just not exceeded. The predicted or estimated temperature at the end of the charging process may depend on the following variables:

initial ambient temperature;
initial temperature of the electronics;
charging capacity;
initial state of charge and nominal capacity of the accumulator and therefore the charging time;
curve of the ambient temperature during charging.

As some values from the previous list are not known, assumptions can be made. For example, the initial charge state of the battery is not known and cannot be queried. Assuming that the users of the mobile device and the supply device in the vehicle maintain their habits and always connect the apparatus to the supply interface (i.e. the USB charging socket) when the battery charge level falls below a certain percentage, it is conceivable that the controller of the supply device stores the amount of energy charged in the past and is therefore capable of learning. The energy required for the currently started charging process can be assumed from the previously amounts of energy actually charged, and included in the calculation, using appropriate statistical algorithms, e.g. the average value from the five most recently stored amounts of energy.

The installation position is also unknown to the microcontroller. If a USB charging socket is installed in a place with good ventilation, it can release more heat into the environment than if it is installed in a place without ventilation. As a result, the electronics heat up at different rates during electrical power supply. This behavior can also be learned from the previous supply processes via the temperature increase over time and included in future calculations.

The method for the electrical supply of loads, in particular for charging accumulators, with a supply interface according to the Universal Serial Bus (USB) standard with an electrical supply device described above has the following steps:

a) measuring the input voltage applied at the input of the supply device and/or the temperature in the area of the supply device; and
b) limiting the output supply power using the currently measured input voltage and/or the currently measured temperature as the controlled variable.

The output supply power can be limited by the apparatus connected to the supply interface, for example by limiting the output current drawn to a maximum output current transmitted by the supply device to the apparatus as a threshold value while keeping the output voltage constant. The supply device effects the limitation of the output supply power by transmitting the maximum output current to the connected apparatus.

The input current applied to the input of the supply device can be measured and the output supply power can be limited using the currently measured input current as the controlled variable.

The efficiency of the electrical supply device can be determined and the output supply power can be limited using the currently determined efficiency as the controlled variable.

The efficiency of the electrical supply device can be determined by calculating the efficiency for a characteristic variable or a combination of characteristic variables selected from the currently determined input voltage, input current, output current and desired output voltage, for example by reading out the efficiencies for the supporting values close to the currently determined input voltage, input current, output current and/or desired output voltage from a stored table and interpolating the efficiency from the efficiencies read out for the supporting values.

The method can be carried out repeatedly by determining the current efficiency when at least one characteristic variable is changed, which is selected from the group of currently measured input voltage, input current, output current and/or temperature and limiting the output supply power with a calculated maximum output current as the controlled variable. For this purpose, the following steps can be carried out:

a) determining the maximum input power from the measured input voltage and the maximum permissible input current;
b) determining the expected efficiency by interpolation from supporting values for efficiencies for a characteristic variable or a combination of characteristic variables selected from the group of input voltage, input current, output current and desired output voltage; and
c) calculating the maximum output current from the maximum input power, the determined efficiency and the desired output voltage.

The desired output voltage usually remains constant and is unchanged even if values are changed. This means that the desired output voltage does not have to be renegotiated with the current collector if values are changed. However, a step of determining any changes in the desired output voltage is conceivable. This can be done by asking the current collector whether anything has changed in the previous desired output voltage, or by a general query of the output voltage desired by the current collector, even if said output voltage is unchanged.

The output supply power can be limited with a calculated specified (maximum) output current or a calculated specified (maximum) input current as the controlled variable with the steps of:

a) determining the desired output voltage;
b) determining the current temperature;
c) determining the maximum permissible losses in the electrical supply device as a function of the maximum input power, taking into account the determined current temperature and a limit temperature specified as the maximum permissible; and
d) determining the specified output current or the specified input current, taking into account the measured input voltage, the desired output voltage and the determined maximum permissible losses.

The steps listed above can be carried out in the order mentioned or in a different order.

The output supply power can be limited taking into account a temperature increase to be expected during the supply or charging process and a specified limit temperature by determining the expected temperature increase taking into account the initial ambient temperature measured at the start of the charging process, the initial temperature of the supply device measured at the start of the charging process, the output supply power, the initial state of charge and the nominal capacity of an accumulator to be charged during the charging process, the expected charging time, the temperature curve during the charging process and/or states from previous charging processes.

Figure 2:
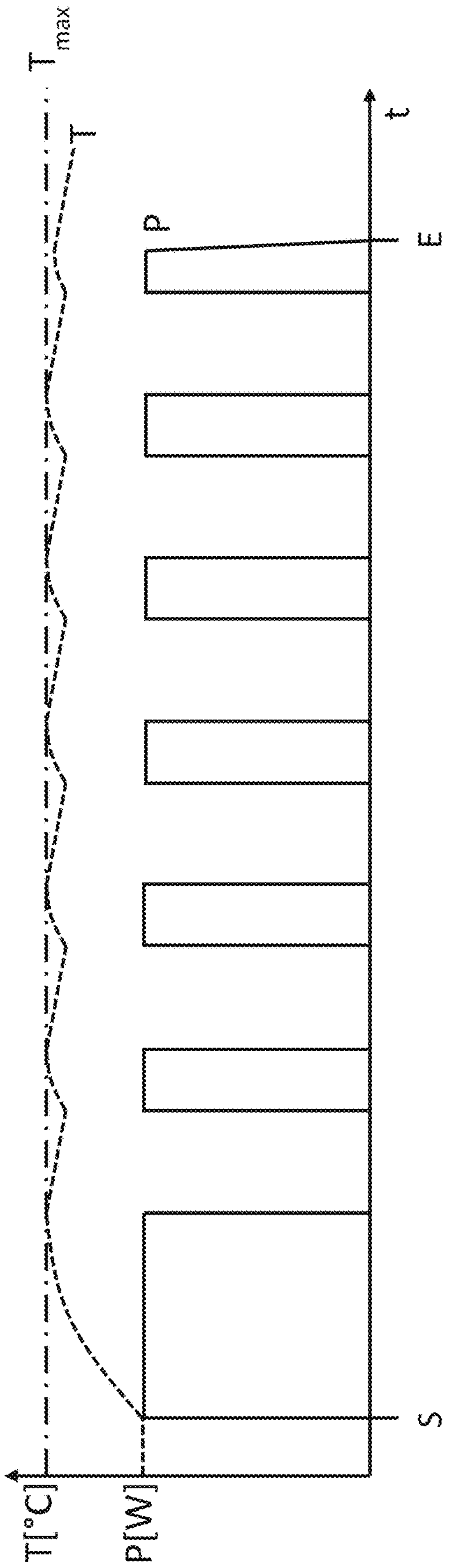
Figure 3:
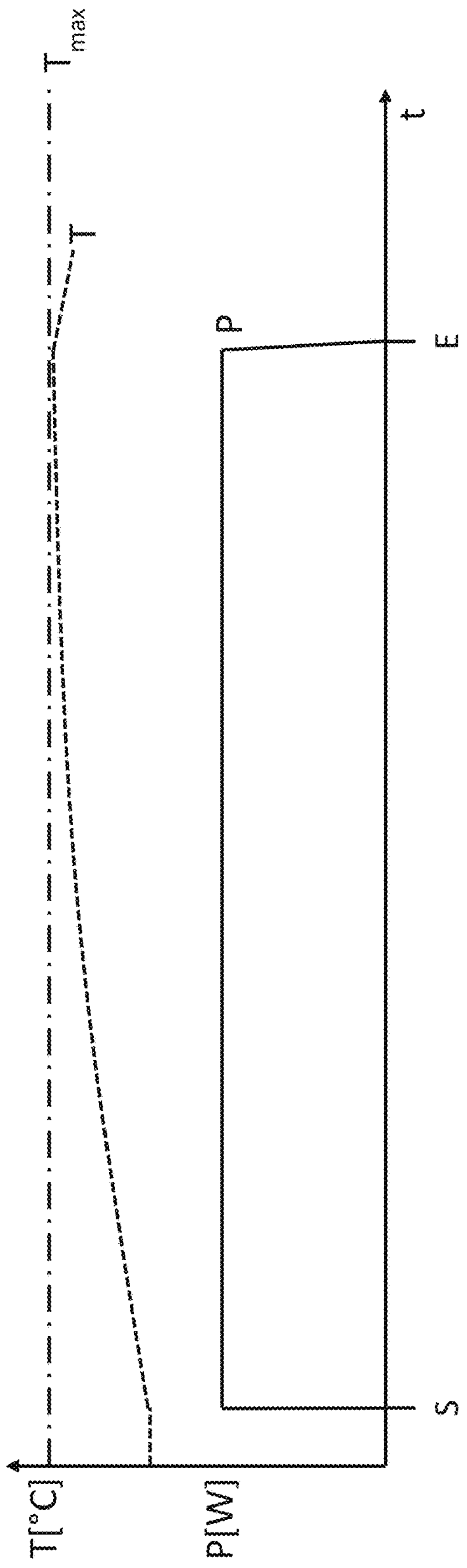
Figure 4:
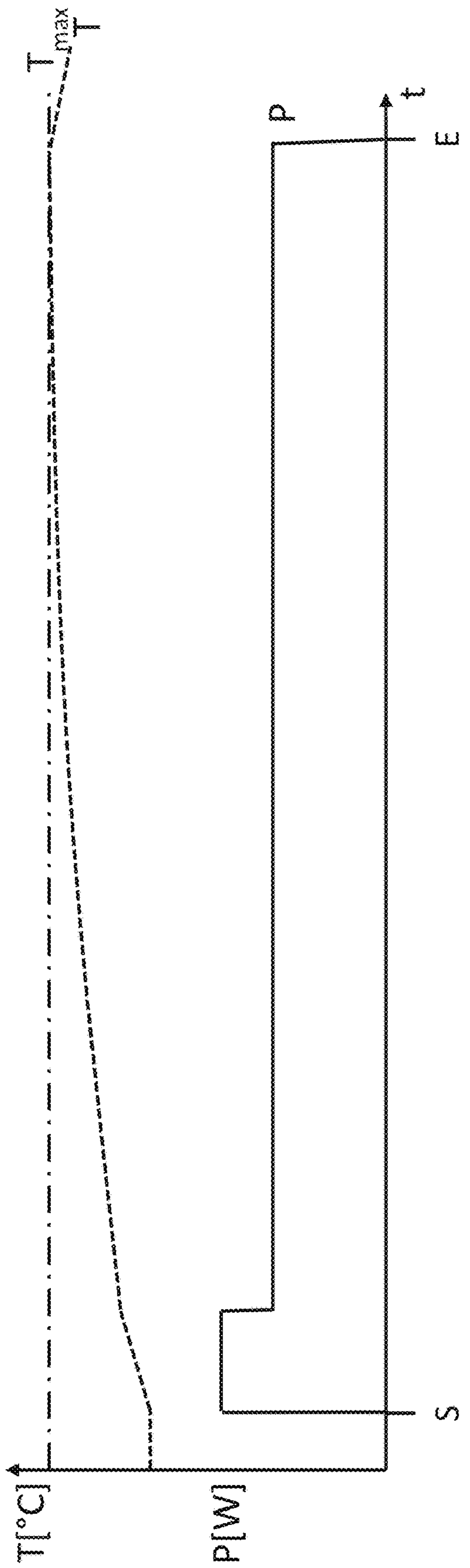
Figure 5:
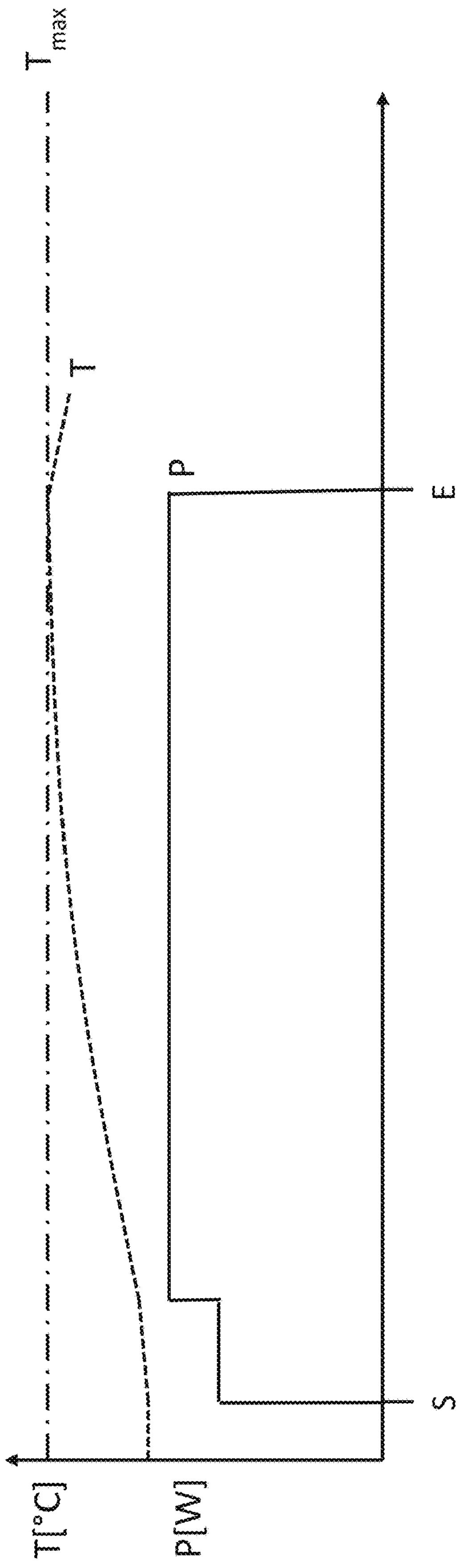

The invention is discussed below by means of exemplary embodiments with the accompanying drawings. In the figures:

FIG. 1—shows a block diagram of an electrical USB supply device;

FIG. 2—shows an exemplary diagram of an output supply power as a function of temperature in a conventional supply or charging process that is interrupted several times when the temperature is exceeded;

FIG. 3—shows an exemplary diagram of an output supply power during a supply or charging process with optimum output supply power;

FIG. 4—shows an exemplary diagram of an output supply power during a supply or charging process with an initially assumed and later downwardly corrected output supply power;

FIG. 5—shows an exemplary diagram of an output supply power during a supply or charging process with an initially assumed and later upwardly corrected output supply power.

FIG. 1 shows a block diagram of an electrical supply device 1 according to the USB standard in the form of a USB-C charging socket of a motor vehicle. For the sake of simplicity, only the elements for generating an output voltage $V_{BUS}$ are given in this block diagram. There may also be other elements for data transmission, such as a USB hub chip or data line drivers. The circuit is supplied with the voltage $V_{IN}$ from a vehicle battery via the input connector. To protect the vehicle battery and the lines between the vehicle battery and the supply electronics, this feed point is usually protected with a fuse (also known as a vehicle fuse or input fuse). The electronics of the supply unit 1 must ensure that the input current $I_{IN}$ does not exceed a maximum current $I_{IN,max}$ during regular operation in order to prevent the fuse from tripping. Such an event would cause a fuse change and thus possibly a visit to the workshop and therefore corresponding costs.

The input voltage $V_{IN}$ and the input current $I_{IN}$ are measured using a voltage measuring element 2 and current measuring element 3 and made available to a controller 5 (power delivery controller), which usually contains a microcontroller. The controller 5 controls a DC/DC converter 4, which converts the input voltage $V_{IN}$ into the required output voltage $V_{BUS}$. The input voltage $V_{IN}$ is usually in the range of about 8 V to 16 V, and the output voltage $V_{BUS}$ can be between 5 V and 20 V according to the Power Delivery specification of the USB standard. Due to this requirement, the DC/DC converter 4 is typically embodied as a buck-boost converter, i.e. it can increase or decrease the input voltage as required.

The controller 5 communicates with the connected apparatus 7, i.e. the current collector or load, via the CC lines with a control signal $CC_{1/2T}$. For example, the apparatus 7 can be an accumulator such as the accumulator of a cell phone.

A control signal $CC_{1/2T}$ is used to negotiate between the power source and apparatus 7 (current collector) via the CC lines, based on the capabilities of the power source and the requirements of the current collector 7, which output voltage $V_{BUS}$ the power source provides at the USB socket, and with which permissible (or maximum) output current $I_{BUS,max}$ the current source 7 may load the current source. If the maximum output current $I_{BUS,max}$ is exceeded, the current source reduces the output voltage $V_{BUS}$ or switches off the output power $P_{BUS}=U_{BUS}*I_{BUS}$ for safety reasons. The current collector 7 is responsible for maintaining the current limit.

Furthermore, a temperature sensor 6 is connected to the controller 5, with which the current temperature $T_t$ is measured. There may also be several temperature sensors 6 at different points on the supply device 1, e.g. printed circuit board (PCB). Typically, the at least one temperature sensor 6 is located near the electronic components that generate the most heat. These are, for example, the switching transistors of the DC/DC converter 4 or an inductance available for such a clocked controller.

The maximum permissible output current $I_{BUS,max}$, which is communicated to the current collector 7 to limit the output supply power $P_{BUS}$, can be determined with the help of a calculation of the efficiency η and a table stored in a data memory, in which efficiencies are stored as a function of the input voltage $V_{IN}$ in volts, the output voltage $V_{BUS}$ in volts and the input current $I_{IN}$ in amperes.

This is explained below using a simplified table as an example. The supporting values at the support points 1 to N can be determined empirically by the manufacturer by means of measurements for a specific type of charging device 1 and, if applicable, its installation situation.

| Support points no. | $V_{IN}$ [V] | $V_{BUS}$ [V] | $I_{IN}$ [A] | η |
|---|---|---|---|---|
| 1 | 9 | 5 | 1 | 0.88 |
| 2 | 9 | 5 | 5 | 0.85 |
| 3 | 9 | 5 | 10 | 0.80 |
| 4 | 14 | 5 | 1 | 0.89 |
| 5 | 14 | 5 | 5 | 0.87 |
| 6 | 14 | 5 | 10 | 0.82 |
| 7 | 9 | 15 | 1 | 0.87 |
| 8 | 9 | 15 | 5 | 0.85 |
| 9 | 9 | 15 | 10 | 0.78 |
| 10 | 14 | 15 | 1 | 0.90 |
| 11 | 14 | 15 | 5 | 0.88 |
| 12 | 14 | 15 | 10 | 0.85 |

In the exemplary calculation based on the above table, it is assumed that the current-consuming mobile apparatus 7 registers a supply requirement of 15.0 V charging voltage (output voltage $V_{BUS}$) with an output current $I_{BUS}$ of 4.5 A (corresponds to $P_{BUS}$=15.0 V×4.5 A=67.5 W output power) for fast charging.

Based on the current temperature $T_t$ and the historical data, for example, it is determined that the maximum power loss $P_V$=5.5 W is permitted so that the temperature T of the electronics does not exceed a critical temperature $T_{max}$ during the entire predicted charging process.

The current input voltage $V_{IN}$ is measured at 13.2 V in this example. The method of successive approximation is used to find the operating point at which losses $P_V$ of 5.5 W occur.

First, the operating point for the input power $P_{IN}$ is considered, which results from the output power $P_{BUS}$ of 67.5 W plus the expected maximum power loss $P_V$ of 5.5 W to $P_{IN}$=73.0 W. Using the formula $I_{IN}=P_{IN}/U_{IN}$, this corresponds to an input current $I_{IN}$ of 5.53 A at the currently measured input voltage $V_{IN}$ of 13.2 V. The two closest support points from the table, where the values are respectively below and above the actual values, are support points 8 and 12. The interpolated efficiency η is therefore 0.85.

At an input power of 73.0 W, 15% losses occur, which corresponds to an absolute power loss of 10.95 W. This value is significantly higher than the permitted 5.5 W; the desired output current cannot be provided and must be limited.

An input current $I_{IN}$ of 3.0 A is assumed as the next operating point. The relevant interpolation points from the table are support points 7 and 11, with the interpolated efficiency being η=0.875. At the input power of now $P_{IN}$=39.6 W and 12.5% losses, the losses are $P_V$=4.95 W, so slightly less than the permitted losses $P_{V,max}$=5.5 W.

Further iteration steps at input currents $I_{IN}$ of 3.5 A and 3.3 A lead to losses of $P_V$=5.45 W (3.3 A and 87.5% efficiency η), which is considered sufficiently accurate for this calculation. The output power $P_{BUS}$ at this operating point is 38.1 W, which corresponds to a maximum output current of $I_{BUS,max}$=2.54 A. The supply device 1 can only supply the current collector 7 with a maximum permissible output supply current $I_{BUS}$, max of 2.54 A if there are to be no interim shutdowns due to excessive temperatures.

The maximum permissible output current $I_{BUS,max}$ can be calculated from the product of the maximum input power $P_{IN}$, max and efficiency η divided by the desired output voltage $V_{BUS}$ of the supply interface according to the formula:

$$I_{BUS,max} = (P_{IN,max} * \eta)/V_{BUS}.$$

The efficiency η can be interpolated in a comparable way if the output current $I_{BUS}$ is included in the above table instead of the input current $I_{IN}$. The maximum permissible input current $I_{IN}$ can then be calculated using the formula:

$$I_{IN,max} = P_{BUS,max}/(\eta * V_{IN}).$$

FIG. 2 shows an exemplary diagram of an output supply power P(t) in watts as a function of the temperature T(t) in degrees Celsius over the time t in a conventional supply or charging process that is interrupted several times after the start S of a supply or charging process if the temperature is exceeded.

An exemplary conventional charging process of a mobile apparatus 7 is shown, in which either charging is carried out with maximum power $P_{BUS,max}$, or in which the output is switched off when the temperature T exceeds a specified maximum temperature $T_{max}$, and the output of the supply device 1 is switched on again when the temperature falls below this temperature T plus a hysteresis. Both the output power P and the temperature T of the USB supply device 1, i.e. the USB electronics, are shown on the vertical axis.

The horizontal axis represents the time t in which charging takes place. The constant interruption of the output power P(t) due to the temperature T(t) of the electronics can be seen. Overall, this extends the charging process considerably. The supply power P(t) is reduced by the connected apparatus 7 towards the end of the supply process, in particular a charging process. If the supply power P falls below 10%, this is regarded as the end of supply or end of charge E.

FIG. 3 shows an exemplary diagram of an output supply power $P_{BUS}(t)$ during a supply or charging process from the start S to the end E over the time t with optimum power $P_{BUS}$.

A slightly reduced supply power P is calculated from the state variables at the start of the supply, e.g. charging, in particular the measurement variables input voltage $V_{IN}$ and temperature T, as well as the output voltage $V_{BUS}$ as the specified setpoint variable and the assumed amount of energy that must be charged, with which the maximum temperature $T_{max}$ is not expected to be reached by the end of the supply or charging process. It can be seen that the temperature increase ΔT at the reduced power is less than with the conventional supply or charging with the full power $P_{max}$ in FIG. 2. At the end E of the supply process, the power P is reduced by the connected apparatus 7, e.g. because the battery is full and only power for trickle charging is required. It can also be seen that the power P did not have to be further reduced over the entire duration of the energy supply from start S to the end E, which has a positive effect on the charging time for accumulators.

FIG. 4 shows an exemplary diagram of an output supply power $P_{BUS}(t)$ during a charging process with an initially assumed and later downwardly corrected supply power $P_{BUS}$.

The start S of the supply process according to the invention shown corresponds to that in FIG. 3. During the supply process, however, a greater than expected increase in temperature is observed. The cause could be, for example, an increase in the ambient temperature, which means that less heat can be dissipated to the environment and then leads to a greater increase in the temperature T of the electronics. In this case, the controller 5 (e.g. the controller) recalculates the output supply power $P_{BUS}$ in order to limit the temperature increase to the maximum temperature $T_{max}$ until the expected end E of the supply process.

The new data determined in this way can optionally be taken into account for the next supply or charging processes and incorporated into the calculation of the next supply or charging process using appropriate algorithms. For example, a one-off readjustment process can be disregarded, but the data can then be incorporated for more frequent processes.

FIG. 5 shows an exemplary diagram of an output supply power $P_{BUS}(t)$ during a supply or charging process with an initially assumed and later upwardly corrected power P.

The opposite case to the supply process in FIG. 4 is shown here. The increase in temperature is less pronounced than expected. By continuously monitoring the temperature T(t) over the time t during the supply process, it is recognized that the output supply power $P_{BUS}(t)$ can be increased. The controller 5 communicates the new maximum output current $I_{BUS,max}$ to the connected apparatus 7. Said maximum output current is then realized by the apparatus 7 connected to the USB port and the entire charging process can thus be completed more quickly without the maximum temperature $T_{max}$ being reached.

The control methods can be implemented in a USB charging socket. This can be done by a computer program with program code means which, when executed on a data processing unit, such as a microcontroller, cause it to control the apparatus 7 connected to the charging device 1 and/or the charging device 1 with the determined controlled variables.

In this case, the supply unit 1 can determine the maximum output current $I_{BUS,max}$ as a function of the input voltage $V_{IN}$ or the temperature T of the USB charging unit 1 and transmit it to the connected apparatus 7, which then performs the power limitation. Such a limitation by the connected apparatus 7 is provided for in the USB standard. Alternatively or additionally, the supply device 1 itself can also be configured to limit the output power $P_{BUS}$ provided as a function of the maximum output current $I_{BUS,max}$.

Here, a power limitation can be made taking into account the efficiency. The efficiency can be determined from the input voltage $V_{IN}$, the output voltage $V_{BUS}$ and the output current $I_{BUS}$. In this case, the temperature T can be included in the efficiency.

The efficiency can be determined by interpolation from stored supporting points.

The calculation of the maximum output supply power $P_{max}$, which should be transmitted to the apparatus 7 (current collector) via the supply interface, can be made taking into account the temperature increase during the supply process.

An adaptation of the output supply power $P_{BUS}$ can be provided to avoid a temperature shutdown. It is advantageous to include data from past supply processes in the current calculation of the controlled variable.

The invention claimed is:

1. An electrical supply device according to the Universal Serial Bus (USB) standard, comprising:
- a controller; and
- a USB plug contact connection,
- wherein the supply device is connectable to an input voltage source ($V_{BAT}$) and provides an electrical output supply power ($P_{BUS}$) at the USB plug contact connection,
- wherein the controller comprises
  - an input voltage measuring unit for measuring an input voltage ($V_{IN}$) applied at an input of the supply device and
  - a temperature measuring unit for measuring a temperature ($T_t$) in an area of the supply device, and
  - wherein the controller is configured to effect a limitation of the output supply power ($P_{BUS}$) by taking into account a temperature increase to be expected during a charging process of an accumulator and a specified limit temperature (Tmax), wherein the controller is further configured to determine the temperature increase to be expected, by taking into account at least one of: an initial ambient temperature (T) measured at a start of the charging process, an initial temperature (T) of the supply device measured at the start of the charging process, an output supply power (PBUS), an initial state of charge and a nominal capacity of the accumulator to be charged in the charging process, an expected charging time, a temperature curve (Tt) during the charging process and/or states from previous charging processes.

2. The electrical supply device according to claim 1, wherein the controller further comprises an input current measuring unit for measuring an input current ($I_{IN}$) applied at the input of the supply device, and wherein the controller is configured to effect a limitation of the output supply power ($P_{BUS}$) using the currently measured input current ($I_{IN}$) as a controlled variable.

3. The electrical supply device according to claim 1 wherein the controller is further configured to determine an efficiency of the electrical supply device, and wherein the controller is configured to effect a limitation of the output supply power ($P_{BUS}$) using the currently determined efficiency as a controlled variable.

4. The electrical supply device according to claim 3 wherein the controller comprises a data memory in which a table with supporting values which are selected from a characteristic variable or a combination of characteristic variables selected from the characteristic variables input voltage ($V_{IN}$), input current ($I_{IN}$), output current ($I_{BUS}$), and output voltage ($V_{BUS}$), and the respective associated efficiency is stored, and wherein the controller is configured to determine the efficiency of the electrical supply device by reading out the efficiencies for the supporting values from the table which are close to a currently determined characteristic value or combination of characteristic values and interpolating the efficiency from the efficiencies read out for the supporting values.

5. The electrical supply device according to claim 3 wherein the controller is configured to determine the efficiency of the electrical supply device by calculating the efficiency for a characteristic variable or a combination of characteristic variables which are selected from the characteristic variables currently determined input voltage ($V_{IN}$), currently determined input current ($I_{IN}$), currently determined output current ($I_{BUS}$) and desired output voltage ($V_{BUS}$).

6. The electrical supply device according to claim 1 wherein the controller is configured to determine the current efficiency when the currently measured input voltage ($V_{IN}$), input current ($I_{IN}$), output current ($I_{BUS}$) and/or temperature ($T_t$) changes, and to effect a limitation of the output supply power ($P_{BUS}$) with a calculated maximum output current ($I_{BUS}$) as the controlled variable, with the steps of:

a) determining a maximum input power ($P_{IN}$) from the measured input voltage ($V_{IN}$) and a the maximum permissible input current ($I_{IN}$);

b) determining an expected efficiency by interpolation from supporting values for efficiencies of combinations of input voltage ($V_{IN}$), input current ($I_{IN}$), output current ($I_{BUS}$) and desired output voltage ($V_{BUS}$); and c) calculating the maximum output current ($I_{BUS}$) from the maximum input power ($P_{IN,max}$), the determined efficiency and the desired output voltage ($V_{BUS}$).

7. The electrical supply device according to claim 1 wherein the controller is configured to effect a limitation of the output supply power ($P_{BUS}$) with a calculated specified output current ($I_{BUS}$) or with a calculated specified input current ($I_{IN}$) as the controlled variable, with the steps of:

a) determining a desired output voltage ($V_{BUS}$);

b) determining the current temperature ($T_t$);

c) determining a maximum permissible losses in the electrical supply device as a function of a maximum input power ($P_{IN}$), taking into account the determined current temperature ($T_t$) and a limit temperature ($T_{max}$) specified as a maximum permissible; and d) determining the specified output current ($I_{BUS}$), taking into account the measured input voltage ($V_{IN}$), the desired output voltage ($V_{BUS}$) and the determined maximum permissible losses.

8. A method for an electrical supply of loads, with a supply interface according to the Universal Serial Bus (USB) standard with an electrical supply device according to claim 1, comprising:

a) measuring an input voltage ($V_{IN}$) applied at an input of the supply device and a temperature ($T_t$) in an area of the supply device;

b) limiting the output supply power ($P_{BUS}$) by taking into account a temperature increase to be expected during a charging process of an accumulator and a specified limit temperature (Tmax), wherein the limiting step comprises determining the temperature increase to be expected, taking into account at least one of: an initial ambient temperature (T) measured at a start of the charging process, an initial temperature (T) of the supply device measured at the start of the charging process, a charging power, an initial state of charge and a nominal capacity of the accumulator to be charged in the charging process, an expected charging time, a temperature curve (T(t)) during the charging process and/or states from previous charging processes.

9. The method according to claim 8, wherein the method further comprises measuring an input current ($I_{IN}$) applied at the input of the supply device and limiting the output supply power ($P_{BUS}$) using the currently measured input current ($I_{IN}$) as a controlled variable.

10. The method according to claim 8 wherein the method further comprises determining an efficiency of the electrical supply device and limiting the output supply power ($P_{BUS}$) using the currently determined efficiency as a controlled variable.

11. The method according to claim 10, wherein determining the efficiency of the electrical supply device is performed by calculating the efficiency for a characteristic variable or a combination of characteristic variables which are selected from the characteristic variables currently determined input voltage ($V_{IN}$), currently determined input current ($I_{IN}$), currently determined output current ($I_{BUS}$) and desired output voltage ($V_{BUS}$), by reading out the efficiencies for the supporting values close to the currently determined at least one characteristic variable from a stored table and interpolating the efficiency from the efficiencies read out for the supporting values.

12. The method according to claim 8 wherein the method comprises determining a current efficiency when at least one of the characteristic variables selected from the currently measured input voltage ($V_{IN}$), currently measured input current ($I_{IN}$) and currently measured output current ($I_{BUS}$) changes, and limiting the output supply power ($P_{BUS}$) with a calculated maximum output current ($I_{BUS,max}$) as the controlled variable, with the steps of:

a) determining the maximum input power ($P_{IN}$) from the measured input voltage ($V_{IN}$) and the maximum permissible input current ($I_{IN}$);

b) determining the expected efficiency by interpolation from supporting values for efficiencies for a characteristic variable or a combination of characteristic variables selected from the group of characteristic variables of input voltage ($V_{IN}$), input current ($I_{IN}$), output current ($I_{BUS}$) and desired output voltage ($V_{BUS}$); and c) calculating the maximum output current ($I_{BUS,max}$) from the maximum input power ($P_{IN,max}$), the determined efficiency and the desired output voltage ($V_{BUS}$).

13. The method according to claim 8 wherein the method comprises limiting the output supply power ($P_{BUS}$) with a calculated specified output current ($I_{BUS}$) or a calculated specified input current ($I_{IN}$) as the controlled variable, with the steps of:

a) determining a desired output voltage ($V_{BUS}$);

b) determining the current temperature ($T_t$);

c) determining a maximum permissible losses in the electrical supply device as a function of a maximum input power ($P_{IN,max}$), taking into account the determined current temperature ($T_t$) and a limit temperature ($T_{max}$) specified as a maximum permissible; and d) determining the specified output current ($I_{BUS}$) or the specified input current ($I_{IN}$), taking into account the measured input voltage ($V_{IN}$), the desired output voltage ($V_{BUS}$) and the determined maximum permissible losses.

* * * * *